(12) United States Patent
Kim

(10) Patent No.: US 10,756,723 B2
(45) Date of Patent: Aug. 25, 2020

(54) SEMICONDUCTOR APPARATUS FOR DETECTING AN EDGE OF A SIGNAL

(71) Applicant: SK hynix Inc., Icheon-si, Gyeonggi-do (KR)

(72) Inventor: Dong Hyun Kim, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 64 days.

(21) Appl. No.: 16/003,617

(22) Filed: Jun. 8, 2018

(65) Prior Publication Data

US 2019/0097621 A1  Mar. 28, 2019

(30) Foreign Application Priority Data

Sep. 27, 2017  (KR) .......................... 10-2017-0125273

(51) Int. Cl.
| H03K 17/14 | (2006.01) |
| H03K 19/21 | (2006.01) |
| H03K 5/00 | (2006.01) |
| G06F 1/06 | (2006.01) |
| H03K 19/20 | (2006.01) |
| H03K 19/0175 | (2006.01) |

(52) U.S. Cl.
CPC ............... *H03K 17/14* (2013.01); *G06F 1/06* (2013.01); *H03K 5/00* (2013.01); *H03K 19/017509* (2013.01); *H03K 19/20* (2013.01); *H03K 19/21* (2013.01); *H03K 2005/00013* (2013.01)

(58) Field of Classification Search
CPC ........ H03K 2005/00013–00293; H03K 17/14; H03K 17/145; H03K 5/00; H03K 5/00006; H03K 19/017509; H03K 19/017518; H03K 19/017527; H03K 19/20; H03K 19/21; H03K 19/212; H03K 19/215; H03K 19/217; H03K 19/23; G06F 1/06
See application file for complete search history.

(56) References Cited

U.S. PATENT DOCUMENTS

2014/0062551 A1*  3/2014  Bhaumik .............. H03L 7/0805
                                                    327/158
2015/0054558 A1*  2/2015  Jang ....................... H03K 5/131
                                                    327/250

(Continued)

FOREIGN PATENT DOCUMENTS

| KR | 101299922 B1 | 8/2013 |
| KR | 1020150021364 A | 3/2015 |

*Primary Examiner* — Patrick C Chen
(74) *Attorney, Agent, or Firm* — William Park & Associates Ltd.

(57) ABSTRACT

A semiconductor apparatus includes first and second edge detection signal generators. The first edge detection signal generator may generate a first edge detection signal by gating an input signal and its inverted signal based on a first gating control signal, generated by delaying the input signal, and output the first edge detection signal to an output node. The second edge detection signal generator may generate a second edge detection signal by gating a complementary signal of the input signal and its inverted signal based on a second gating control signal, generated by delaying the complementary signal, and output the second edge detection signal to the output node. An output signal may be generated at the output node.

11 Claims, 5 Drawing Sheets

(56) References Cited

U.S. PATENT DOCUMENTS

2016/0072484 A1* 3/2016 Jarrar ................ H03K 3/35625
　　　　　　　　　　　　　　　　　　　327/202
2016/0134266 A1* 5/2016 Cohen .................... H03K 5/135
　　　　　　　　　　　　　　　　　　　327/158

* cited by examiner

SEMICONDUCTOR APPARATUS FOR DETECTING AN EDGE OF A SIGNAL

CROSS-REFERENCES TO RELATED APPLICATION

The present application claims priority under 35 U.S.C. § 119(a) to Korean application number 10-2017-0125273, filed on Sep. 27, 2017, in the Korean Intellectual Property Office, which is incorporated herein by reference in its entirety.

BACKGROUND

1. Technical Field

Various embodiments relate to semiconductor technology and, more particularly, to a semiconductor apparatus capable of detecting an edge of a signal.

2. Related Art

A semiconductor apparatus, such as a semiconductor apparatus included in a computer system, may operate in synchronization with a clock signal. The semiconductor apparatus may include an edge detection circuit to receive a clock signal and operate in synchronization with an edge of the clock signal. A frequency of a clock signal is proportional to the operating speed of a semiconductor apparatus. High frequency clock signals, in particular, have narrow pulse widths. Therefore it is important to precisely detect an edge of a clock signal for accurate synchronization during operation of a semiconductor apparatus having a high clock speed. However, precisely detecting an edge of a clock signal is problematic due to a skew caused by process, voltage, and temperature PVT variation and/or variation among intrinsic transistor characteristics.

SUMMARY

In accordance with an embodiment of the present teachings, a semiconductor apparatus may include a first edge detection signal generator configured to generate a first edge detection signal by gating an input signal and an inverted signal of the input signal based on a first gating control signal, generated by delaying the input signal, and configured to output the first edge detection signal to an output node. The semiconductor apparatus may also include a second edge detection signal generator configured to generate a second edge detection signal by gating a complementary signal of the input signal and an inverted signal of the complementary signal based on a second gating control signal, generated by delaying the complementary signal and configured to output the second edge detection signal to the output node, where an output signal is generated.

In accordance with another embodiment of the present teachings, a semiconductor apparatus may include an edge detection circuit configured to generate a first edge detection signal by detecting rising and falling edges of an input clock signal, generate a second edge detection signal by detecting rising and falling edges of a complementary signal of the input clock signal, and generate an output clock signal by combining the first and second edge detection signals. The semiconductor apparatus may also include a differential clock generator configured to generate first and second clock signals based on the output clock signal.

BRIEF DESCRIPTION OF THE DRAWINGS

Features, aspects, and embodiments are described in conjunction with the attached drawings, in which.

DETAILED DESCRIPTION

Semiconductor apparatuses in accordance with the present disclosure are described below with reference to the accompanying drawings and through exemplary embodiments. For example, a presented semiconductor apparatus is capable of generating an accurate edge detection signal regardless of process, voltage, and temperature PVT variation and/or variation among intrinsic transistor characteristics.

Figure 1:
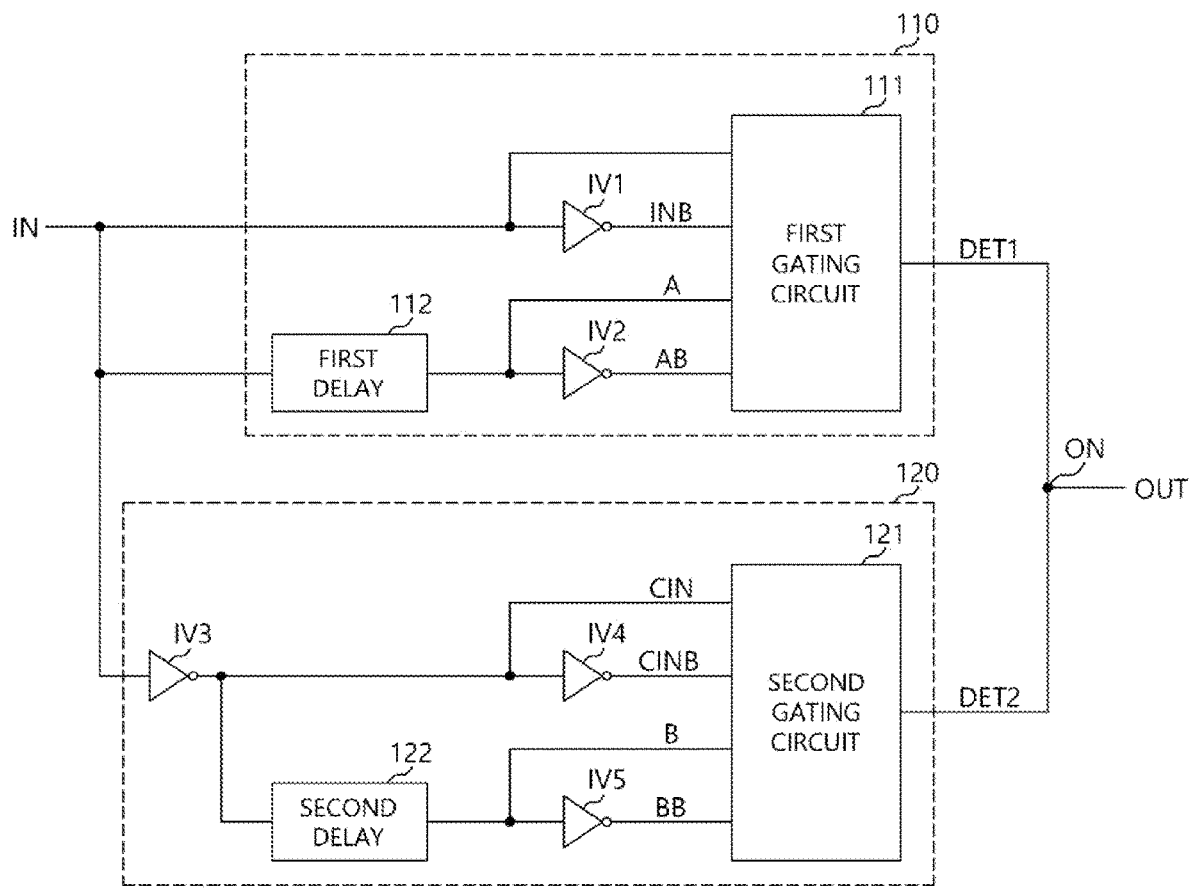
FIG. 1 shows a schematic diagram illustrating a configuration of a semiconductor apparatus, in accordance with an embodiment.

FIG. 1 shows a schematic diagram illustrating a configuration of a semiconductor apparatus 1, in accordance with an embodiment of the present teachings. The semiconductor apparatus 1 may be an edge detection circuit configured to detect an edge of an input signal IN and output the detection result as an output signal OUT. The input signal IN may be a toggling signal, such as a clock signal. Referring to FIG. 1, the semiconductor apparatus 1 may include a first edge detection signal generator 110 and a second edge detection signal generator 120. The first edge detection signal generator 110 may be configured to receive the input signal IN to generate a first edge detection signal DET1. The first edge detection signal generator 110 may output the first edge detection signal DET1 to an output node ON. The first edge detection signal generator 110 may generate the first edge detection signal DET1 by detecting rising and falling edges of the input signal IN. The first edge detection signal generator 110 may generate the first edge detection signal DET1 by gating the input signal IN and an inverted signal INB of the input signal IN based on first gating control signals A and AB, which are generated by delaying the input signal IN. The first edge detection signal generator 110 may include a first gating circuit 111. The first gating circuit 111 may generate the first edge detection signal DET1 by gating the input signal IN and the inverted signal INB based on the first gating control signals A and AB. The first edge detection signal generator 110 may further include a first inverter IV1, a first delay circuit 112, and a second inverter IV2. The first inverter IV1 may generate the inverted signal INB by inverting the input signal IN. The first delay circuit 112 may delay the input signal IN by a predetermined amount of time. The predetermined amount of time for the first delay circuit 112 may arbitrarily change. For example, the predetermined amount of time may be less than an amount of time corresponding to a pulse width of the input signal IN. The second inverter IV2 may invert an output of the first delay circuit 112. The output of the first delay circuit 112 may be provided as the first gating control signal A, and the output of the second inverter IV2 may be provided as an inverted signal AB of the first gating control signal A. The first gating control signal A and the inverted signal AB of the first gating control signal A may be referred to as the first gating control signals.

The second edge detection signal generator 120 may be configured to receive the input signal IN to generate a second edge detection signal DET2. The second edge detection signal generator 120 may output the second edge detection signal DET2 to the output node ON. The second edge detection signal generator 120 may generate the second edge detection signal DET2 by detecting rising and falling edges of a complementary signal CIN of the input signal IN. The complementary signal CIN may be generated by inverting the input signal IN. For example, the complementary signal CIN may have substantially same phase as the inverted signal INB. The second edge detection signal generator 120 may generate the second edge detection signal DET2 by gating the complementary signal CIN and an inverted signal CINB of the complementary signal CIN based on second gating control signals B and BB, which are generated by delaying the complementary signal CIN. The second edge detection signal generator 120 may include a second gating circuit 121. The second gating circuit 121 may generate the second edge detection signal DET2 by gating the complementary signal CIN and the inverted signal CINB of the complementary signal CIN based on the second gating control signals B and BB. The second edge detection signal generator 120 may further include a third inverter IV3, a fourth inverter IV4, a second delay circuit 122, and a fifth inverter IV5.

The third inverter IV3 may generate the complementary signal CIN by inverting the input signal IN. The fourth inverter IV4 may generate the inverted signal CINB of the complementary signal CIN by inverting the complementary signal CIN. The second delay circuit 122 may delay the complementary signal CIN by a predetermined amount of time. The predetermined amount of time for the second delay circuit 122 may be the same as the predetermined amount of time for the first delay circuit 112. In another embodiment, the delay amount for the second delay circuit 122 may be different from the delay amount for the first delay circuit 112. The fifth inverter IV5 may invert an output of the second delay circuit 122. The output of the second delay circuit 122 may be provided as the second gating control signal B, and the output of the fifth inverter IV5 may be provided as an inverted signal BB of the second gating control signal B. The second gating control signal B and the inverted signal BB of the second gating control signal B may be referred to as the second gating control signals.

The output signal OUT of the semiconductor apparatus 1 may be generated at the output node ON. The first edge detection signal generator 110 may output the first edge detection signal DET1 to the output node ON, and the second edge detection signal generator 120 may output the second edge detection signal DET2 to the output node ON. That is, the output node ON may commonly receive the first and second edge detection signals DET1 and DET2. Therefore, phases of the first and second edge detection signals DET1 and DET2 may be mixed at the output node ON, and the resulting phase-mixed signal may be generated as the output signal OUT.

The first and second gating circuits 111 and 121 may each perform a gating logic operation. In some embodiments, the first and second gating circuits 111 and 121 may each perform the same gating logic operation. For example, the first and second gating circuits 111 and 121 each perform an exclusive OR (XOR) operation. In other embodiments, one of or each of the first and second gating circuits 111 and 121 may perform a different gating logic operation.

The first gating circuit 111 may generate the first edge detection signal DET1 by performing an XOR operation to the input signal IN, the inverted signal INB of the input signal IN, the first gating control signal A, and the inverted signal AB of the first gating control signal A. The second gating circuit 121 may generate the second edge detection signal DET2 by performing an XOR operation to the complementary signal CIN, the inverted signal CINB of the complementary signal CIN, the second gating control signal B, and the inverted signal BB of the second gating control signal B.

The first and second gating circuits 111 and 121 may generate the first and second edge detection signals DET1 and DET2, respectively, which are complementary to each other under the same characteristic situation of logic circuits and/or transistors because the first and second gating circuits 111 and 121 receive complementary signals. The output signal OUT may be more accurate and/or have greater consistency in its duty cycle as compared to the first and second edge detection signals DET1 and DET2 considered individually because the output signal OUT is generated by mixing the first and second edge detection signals DET1 and DET2.

Figure 2:
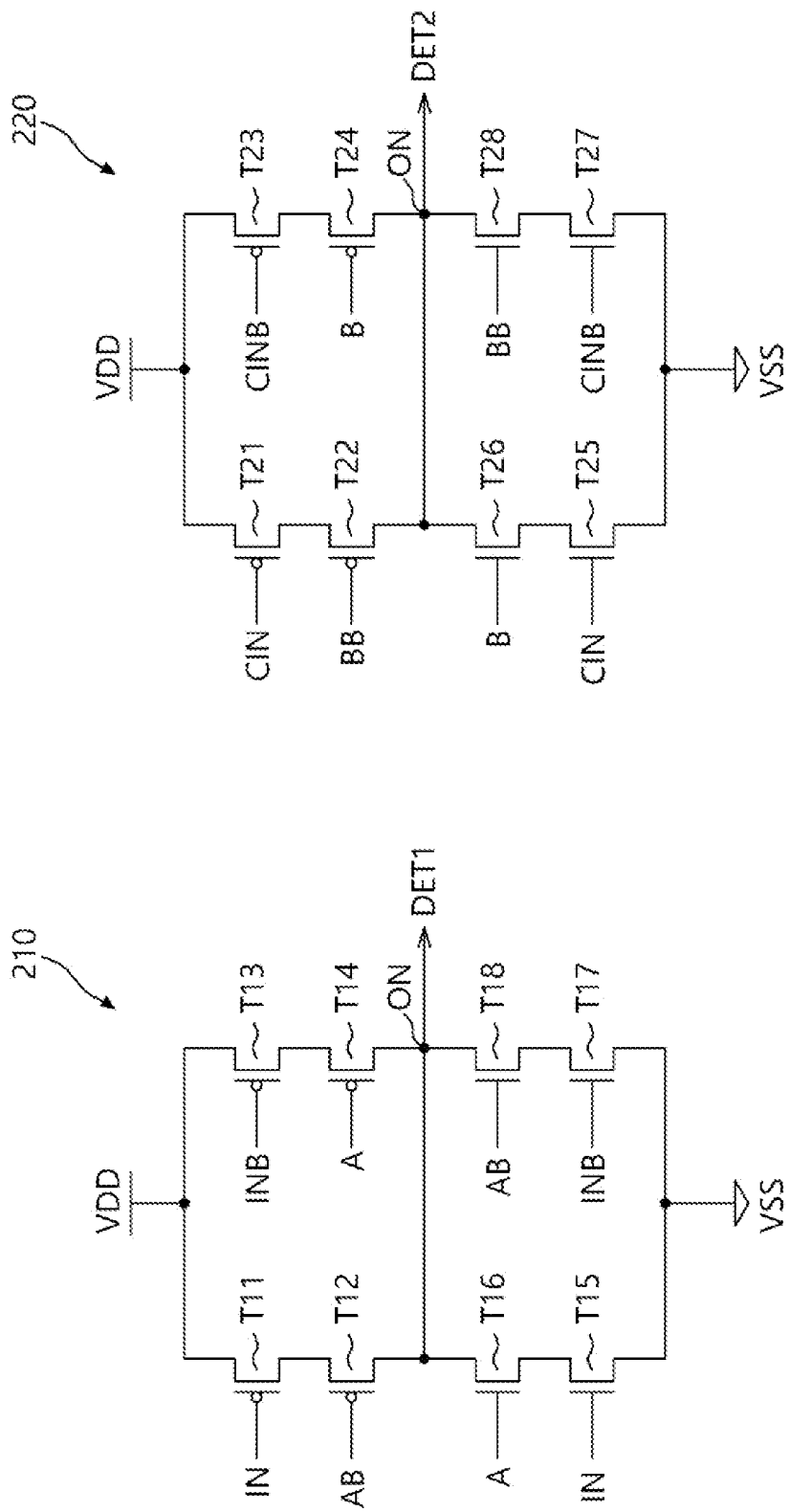
FIG. 2 shows a schematic diagram illustrating a configuration of a first gating circuit and a second gating circuit, in accordance with an embodiment.

FIG. 2 shows a schematic diagram illustrating a configuration of a first gating circuit 210 and a second gating circuit 220, in accordance with an embodiment of the present teachings. For some embodiments, the first and second gating circuits 210 and 220 represent the first and second gating circuits 111 and 121, respectively, of FIG. 1. The first gating circuit 210 may include a first transistor T11, a second transistor T12, a third transistor T13, a fourth transistor T14, a fifth transistor T15, a sixth transistor T16, a seventh transistor T17, and an eighth transistor T18. The first to fourth transistors T11, T12, T13, and T14 may be P-channel MOS transistors, and the fifth to eighth transistors T15, T16, T17, and T18 may be N-channel MOS transistors.

The first transistor T11 may receive the input signal IN at its gate and may be coupled to a power voltage VDD at its source. The second transistor T12 may receive the inverted signal AB of the first gating control signal A at its gate, may be coupled to a drain of the first transistor T11 at its source, and may be coupled to the output node ON at its drain. The third transistor T13 may receive the inverted signal INB of the input signal IN at its gate and may be coupled to the power voltage VDD at its source. The fourth transistor T14 may receive the first gating control signal A at its gate, may be coupled to a drain of the third transistor T13 at its source, and may be coupled to the output node ON at its drain. The fifth transistor T15 may receive the input signal IN at its gate and may be coupled to a ground voltage VSS at its source. The sixth transistor T16 may receive the first gating control signal A at its gate, may be coupled to the output node ON at its drain, and may be coupled to a drain of the fifth transistor T15 at its source. The seventh transistor T17 may receive the inverted signal INB of the input signal IN at its gate and may be coupled to the ground voltage VSS at its source. The eighth transistor T18 may receive the inverted signal AB of the first gating control signal A at its gate, may be coupled to the output node ON at its drain, and may be coupled to a drain of the seventh transistor T17 at its source. The first edge detection signal DET1 may be output through the output node ON.

The second gating circuit 220 may include a first transistor T21, a second transistor T22, a third transistor T23, a fourth transistor T24, a fifth transistor T25, a sixth transistor T26, a seventh transistor T27, and an eighth transistor T28. The first to fourth transistors T21, T22, T23, and T24 may be P-channel MOS transistors, and the fifth to eighth transistors T25, T26, T27, and T28 may be N-channel MOS transistors.

The first transistor T21 may receive the complementary signal CIN of the input signal IN at its gate and may be coupled to the power voltage VDD at its source. The second transistor T22 may receive the inverted signal BB of the second gating control signal B at its gate, may be coupled to a drain of the first transistor T21 at its source, and may be coupled to the output node ON at its drain. The third transistor T23 may receive the inverted signal CINB of the complementary signal CIN at its gate and may be coupled to the power voltage VDD at its source. The fourth transistor T24 may receive the second gating control signal B at its gate, may be coupled to a drain of the third transistor T23 at its source, and may be coupled to the output node ON at its drain. The fifth transistor T25 may receive the complementary signal CIN at its gate and may be coupled to the ground voltage VSS at its source. The sixth transistor T26 may receive the second gating control signal B at its gate, may be coupled to the output node ON at its drain, and may be coupled to a drain of the fifth transistor T25 at its source. The seventh transistor T27 may receive the inverted signal CINB of the complementary signal CIN at its gate and may be coupled to the ground voltage VSS at its source. The eighth transistor T28 may receive the inverted signal BB of the second gating control signal B at its gate, may be coupled to the output node ON at its drain, and may be coupled to a drain of the seventh transistor T27 at its source. The second edge detection signal DET2 may be output through the output node ON.

Figure 3:
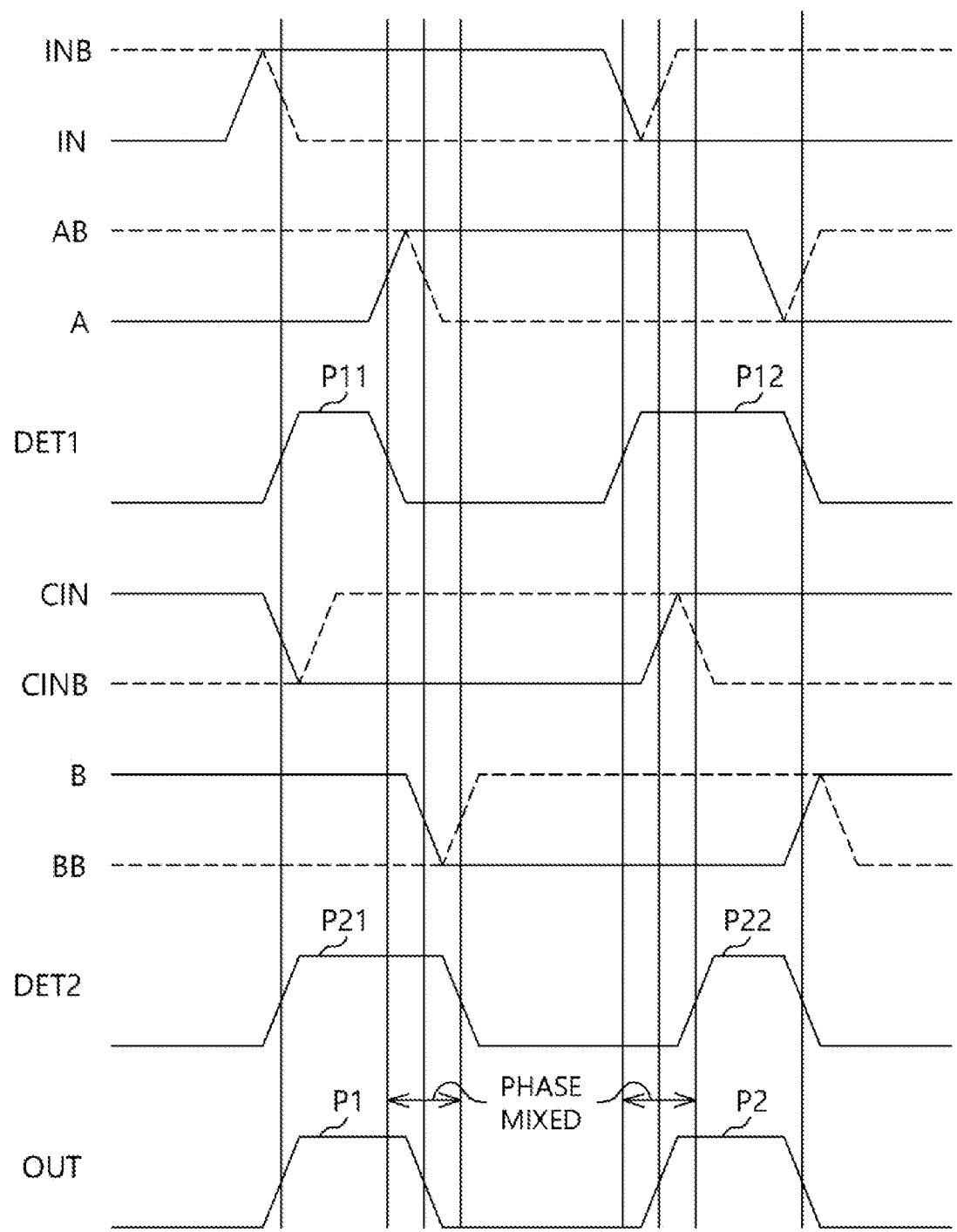
FIG. 3 shows a timing diagram illustrating an operation of a semiconductor apparatus, in accordance with an embodiment.

FIG. 3 shows a timing diagram illustrating an operation of the semiconductor apparatus 1 in accordance with an embodiment of the present teachings. Described with reference to FIGS. 1, 2, and 3 is an operation of the semiconductor apparatus 1. FIG. 3 may be predicated on an assumption that the inverted signal INB is delayed by an amount of time with respect to the input signal IN due to process, voltage, and temperature (PVT) variation and/or variation among intrinsic transistor characteristics. Rising and falling edges of the input signal IN may be on time while rising and falling edges of the inverted signal INB may be delayed. Further, based on the predicated assumption for FIG. 3, the inverted signal AB is delayed with respect to the first gating control signal A. Also, the inverted signal CINB is delayed with respect to the complimentary signal CIN, and the inverted signal BB is delayed with respect to the second gating control signal B.

When the input signal IN is at a low level, the inverted signal INB is at a high level, the first gating control signal A is at a low level, and the first gating control signal AB is at a high level, the seventh transistor T17 and the eighth transistor T18 may both be turned on, and thus, the first gating circuit 210 may output the first edge detection signal DET1 at a low level. Specifically, the output node ON has a closed connection to the ground voltage VSS through the N-channel MOS transistors T17 and T18, and the output node ON has an open connection with the power voltage VDD. Although a level of the input signal IN changes to a high level from a low level, a level of the inverted signal INB may not change due to the delay of the inverted signal INB, and thus, the first edge detection signal DET1 may stay at a low level. When the level of the inverted signal INB changes from a high level to a low level, the third transistor T13 may be turned on, and the first gating circuit 210 may enable the first edge detection signal DET1 to a high level. Specifically, the output node ON has a closed connection to the power voltage VDD through the P-channel MOS transistors T13 and T14, and the output node ON has an open connection with the ground voltage VSS. When the level of the first gating control signal A changes from a low level to a high level, the fourth transistor T14 may be turned off and the first gating circuit 210 may disable the first edge detection signal DET1 to a low level. A first pulse P11 of the first edge detection signal DET1 may be enabled in synchronization with a falling edge of the inverted signal INB at a delayed time point and may be disabled in synchronization with a rising edge of the first gating control signal A at a normal time point, and thus, the first pulse P11 of the first edge detection signal DET1 may have a first pulse width, which is relatively narrow as compared to a second pulse width.

When the input signal IN stays at a high level, the inverted signal INB of the input signal IN stays at a low level, the first gating control signal A stays at a high level, and the inverted signal AB of the first gating control signal A stays at a low level, the first gating circuit 210 may keep the first edge detection signal DET1 as disabled (low level). Then, when the level of the input signal IN changes from a high level to a low level, the first transistor T11 may be turned on, and the first gating circuit 210 may enable the first edge detection signal DET1 to a high level. The level of the first gating control signal A may change from a high level to a low level before the level of the inverted signal AB of the first gating control signal A changes. However, although level of the first gating control signal A changes, the first gating circuit 210 may keep the first edge detection signal DET1 at a high level until the level of the inverted signal AB of the first gating control signal A changes. When the level of the inverted signal AB of the first gating control signal A changes from a low level to a high level, the eighth transistor T18 may be turned on and the first gating circuit 210 may disable the first edge detection signal DET1 to a low level. A second pulse P12 of the first edge detection signal DET1 may be enabled in synchronization with a falling edge of the input signal IN at a normal time point and may be disabled in synchronization with a rising edge of the first gating control signal AB at a delayed time point, and thus, the second pulse P12 of the first edge detection signal DET1 may have the second pulse width, which is relatively wide as compared to the first pulse width.

When the complementary signal CIN of the input signal IN is at a high level, the inverted signal CINB is at a low level, the second gating control signal B is at a high level, and the inverted signal BB of the second gating control signal B is at a low level, the fifth transistor T25 and the sixth transistor T26 may be turned on, and thus, the second gating circuit 220 may output the second edge detection signal DET2 at a low level. When the level of the complementary signal CIN changes from a high level to a low level, the first transistor T21 may be turned on and the second gating circuit 220 may enable the second edge detection signal DET2 to a high level. Then, although the level of the inverted signal CINB changed from a low level to a high level or the level of the second gating control signal B changed from a high level to a low level, the second gating circuit 220 may keep the second edge detection signal DET2 enabled (high level). When the level of the inverted signal BB of the second gating control signal B changes from a low level to a high level, the eighth transistor T28 may be turned on, and the second gating circuit 220 may disable the second edge detection signal DET2 to a low level. A first pulse P21 of the second edge detection signal DET2 may be enabled in synchronization with a falling edge of the complementary signal CIN at a normal time point and may be disabled in synchronization with a rising edge of the second gating control signal BB at a delayed time point, and thus, the first pulse P21 of the second edge detection signal DET2 may have the second pulse width, which is relatively wide as compared to the first pulse width.

When the complementary signal CIN stays at a low level, the inverted signal CINB stays at a high level, the second gating control signal B stays at a low level, and the inverted signal BB of the second gating control signal B stays at a high level, the second gating circuit 220 may keep the second edge detection signal DET2 as disabled. Then, even when the level of the complementary signal CIN changes from a low level to a high level, the second gating circuit 220 may keep the second edge detection signal DET2 disabled. When the level of the inverted signal CINB changes from a high level to a low level, the third transistor T23 may be turned on, and the second gating circuit 220 may enable the second edge detection signal DET2 to a high level. The level of the second gating control signal B may change from a low level to a high level before the level of the inverted signal BB changes. When the level of the second gating control signal B changes from a low level to a high level, the sixth transistor T26 may be turned on, and the second gating circuit 220 may disable the second edge detection signal DET2 to a low level. The second pulse P22 of the second edge detection signal DET2 may be enabled in synchronization with a falling edge of the inverted signal CINB at a delayed time point and may be disabled in synchronization with a rising edge of the second gating control signal B at a normal time point, and thus, the second pulse P22 of the second edge detection signal DET2 may have the first pulse width, which is relatively narrow as compared to the second pulse width.

Phases of the first edge detection signal DET1 and the second edge detection signal DET2 may be mixed at the output node ON, and the mixed signal may be output as the output signal OUT. Because the first pulse P11 of the first edge detection signal DET1 has the first pulse width and the first pulse P21 of the second edge detection signal DET2 has the second pulse width, the output signal OUT may have a first pulse P1 of a third pulse width when phases of the first pulses P11 and P21 of the first and second edge detection signals DET1 and DET2 are mixed. The third pulse width may be wider than the first pulse width and narrower than the second pulse width. Because the second pulse P12 of the first edge detection signal DET1 has the second pulse width and the second pulse P22 of the second edge detection signal DET2 has the first pulse width, the output signal OUT may have a second pulse P2 of the third pulse width when phases of the second pulses P12 and P22 of the first and second edge detection signals DET1 and DET2 are mixed. As described above, the first gating circuit 210 and the second gating circuit 220 may perform gating operation complementary to each other and the semiconductor apparatus 1 may generate the output signal OUT by mixing the phases of the first and second edge detection signals DET1 and DET2. Therefore, the semiconductor apparatus 1 may output the output signal OUT with substantially consistent pulse widths regardless of PVT variation and/or variation among intrinsic transistor characteristics. In an embodiment, although the inverted signal INB is delayed in comparison with the input signal IN, the semiconductor apparatus 1 may generate the output signal OUT having a more accurate and/or a more consistent pulse width by using the first and second edge detection signal generators 110 and 120, which operate complementarily to each other, even when various delays occur due to variation in hardware characteristics and operation environment.

Figure 4:
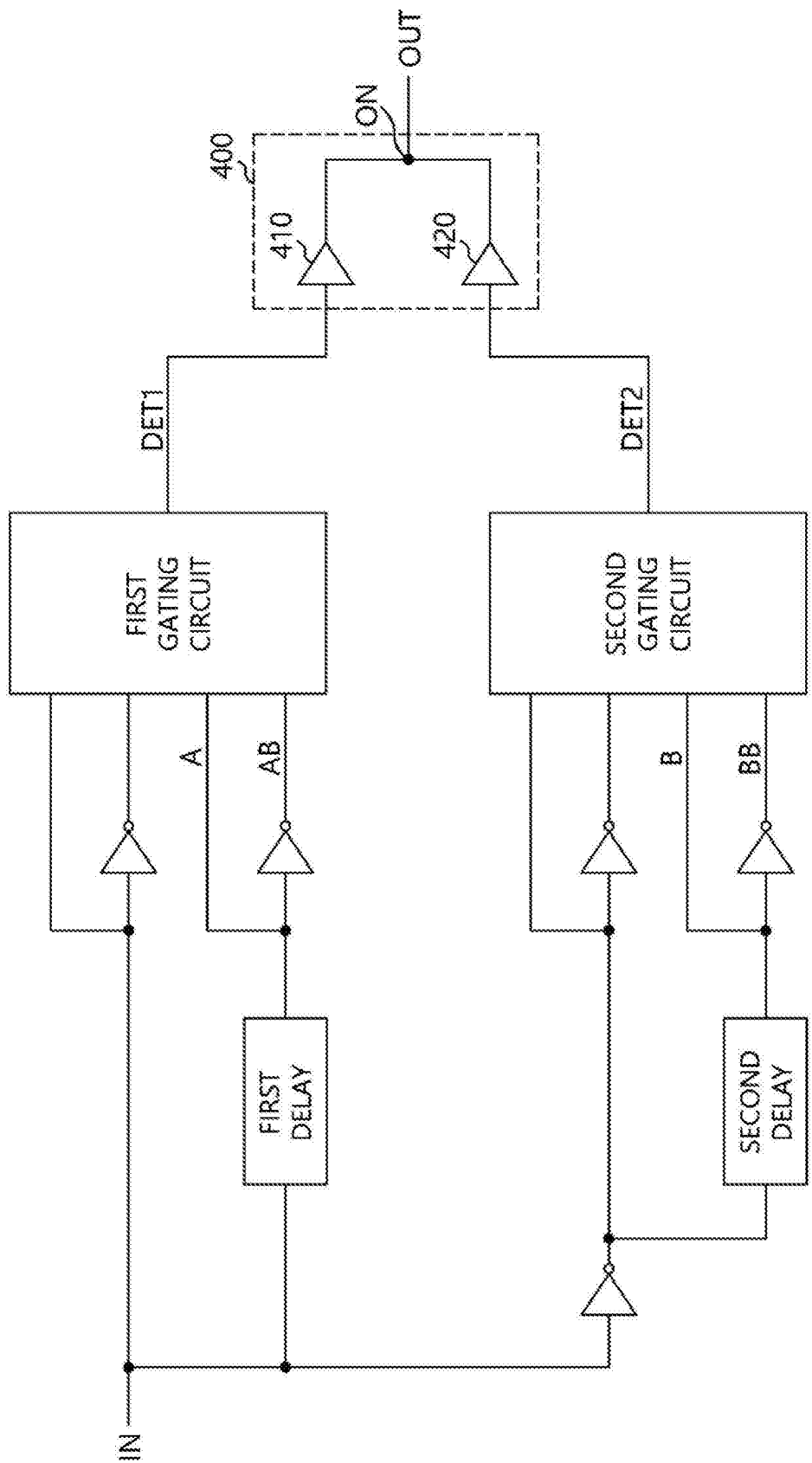
FIG. 4 shows a schematic diagram illustrating an configuration of a semiconductor apparatus, in accordance with an embodiment.

FIG. 4 shows a schematic diagram illustrating an operation of a semiconductor apparatus 2 in accordance with an embodiment of the present teachings. For some embodiments, the semiconductor apparatus 2 may be similar to the semiconductor apparatus 1 of FIG. 1, but the semiconductor apparatus 2 further includes a phase mixer 400. Descriptions for like components between the semiconductor apparatus 2 and the semiconductor apparatus 1 are not repeated here. The phase mixer 400 may receive the first edge detection signal DET1 and the second edge detection signal DET2 to generate the output signal OUT. The phase mixer 400 may generate the output signal OUT by mixing the phases of the first and second edge detection signals DET1 and DET2. Referring back to FIG. 1, the semiconductor apparatus 1 may mix the phases of the first and second edge detection signals DET1 and DET2 by simply outputting the first and second edge detection signals DET1 and DET2 to the output node ON. Referring to FIG. 4, the semiconductor apparatus 2 may precisely mix the phases of the first and second edge detection signals DET1 and DET2 using the phase mixer 400. The phase mixer 400 may include a first buffer 410 and a second buffer 420. The first buffer 410 may buffer the first edge detection signal DET1 and output the first edge detection signal DET1 to the output node ON. The second buffer 420 may buffer the second edge detection signal DET2 and output the second edge detection signal DET2 to the output node ON. The output signal OUT may be generated at the output node ON. In an embodiment, a mixture rate of the phase mixer 400 may change in response to a control signal. In another embodiment, the phase mixer 400 may variously change the mixture rate between phases of the first and second edge detection signals DET1 and DET2 in order to set, manipulate, or tune the duty cycle of the output signal OUT.

Figure 5:
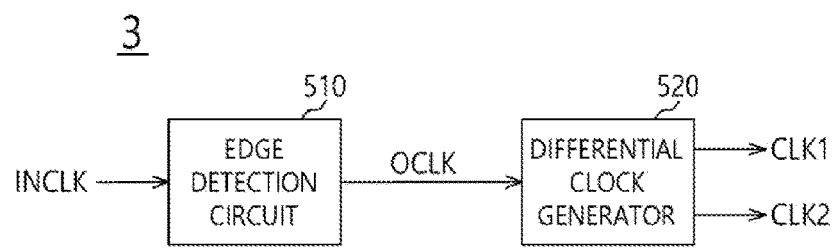
FIG. 5 shows a schematic diagram illustrating an configuration of a semiconductor apparatus, in accordance with an embodiment.

FIG. 5 shows a schematic diagram illustrating an operation of a semiconductor apparatus 3 in accordance with an embodiment of the present teachings. The semiconductor apparatus 3 may receive an input clock signal INCLK and output first and second clock signals CLK1 and CLK2. The first and second clock signals CLK1 and CLK2 may be a pair of differential clock signals, which are complementary to each other. For example, the semiconductor apparatus 3 may be applied as a phase splitter configured to divide a phase of an input signal. Referring to FIG. 5, the semiconductor apparatus 3 may include an edge detection circuit 510 and a differential dock generator 520. The edge detection circuit 510 may receive the input clock signal INCLK and generate an output clock signal OCLK. The semiconductor apparatus 1 of FIG. 1 may be applied as the edge detection circuit 510. The edge detection circuit 510 may generate the output clock signal OCLK having accurate and/or consistent pulse width and/or duty cycle regardless of PVT variation and/or intrinsic characteristics of a transistor.

The differential clock generator 520 may generate the first and second clock signals CLK1 and CLK2 based on the output clock signal OCLK. The differential clock generator 520 may generate the first and second clock signals CLK1 and CLK2 toggling in synchronization with rising and falling edges of the output clock signal OCLK. The differential clock generator 520 may generate the first and second clock signals CLK1 and CLK2 having accurate and/or consistent duty ratio since the differential clock generator 520 may generate the first and second clock signals CLK1 and CLK2 based on the output clock signal OCLK having accurate and/or consistent pulse width and/or duty cycle and provided from the edge detection circuit 510. The differential clock generator 520 may be configured with a general differential amplifier and/or a toggle flip-flop.

Figure 6:
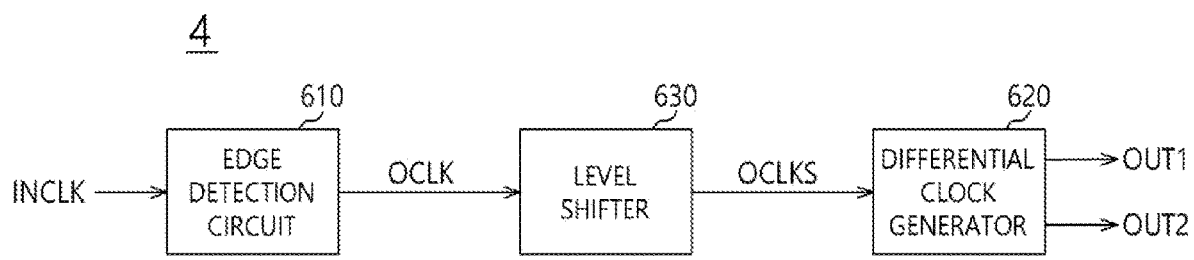
FIG. 6 shows a schematic diagram illustrating an configuration of a semiconductor apparatus, in accordance with an embodiment.

FIG. 6 shows a schematic diagram illustrating an operation of a semiconductor apparatus 4 in accordance with an embodiment of the present teachings. Referring to FIG. 6, the semiconductor apparatus 4 may include an edge detection circuit 610, a level shifter 630, and a differential clock generator 620. The semiconductor apparatus 4 may be applied as a level shifter circuit configured to change a swing range of an input signal and output the changed signal. The edge detection circuit 610 receive an input clock signal INCLK and generate an output clock signal OCLK. The semiconductor apparatus 1 of FIG. 1 may be applied as the edge detection circuit 610. The level shifter 630 may receive the output clock signal OCLK and change the swing range of the output clock signal OCLK. The level shifter 630 may generate a shifted output clock signal OCLKS by changing the swing range of the output clock signal OCLK. The differential clock generator 620 may receive the shifted output clock signal OCLKS to generate first and second clock signals CLK1 and CLK2. A duty cycle of an output signal output from a general level shifter may change due to PVT variation and/or intrinsic characteristics of a transistor. In accordance with an embodiment, the semiconductor apparatus 4 may generate an output signal having accurate and/or consistent duty ratio regardless of PVT variation and/or intrinsic characteristics of a transistor since the semiconductor apparatus 4 includes the level shifter 630 between the edge detection circuit 610 and the differential clock generator 620.

While certain embodiments have been described above, it will be understood to those skilled in the art that the described embodiments serve as illustrative examples and that additional embodiments are possible which are consistent with the scope of the present teachings and with the claims listed below. Accordingly, a semiconductor apparatus for detecting an edge of signal should not be limited based on the described embodiments. Rather, a disclosed semiconductor apparatus should be considered in light of the claims that follow when taken in conjunction with the above description and accompanying drawings.

What is claimed is:

1. A semiconductor apparatus comprising:
a first edge detection signal generator configured to generate a first edge detection signal by performing an exclusive OR operation to an input clock signal, an inverted signal of the input clock signal, a first gating control signal which is generated by delaying the input clock signal, and an inverted signal of the first gating control signal;
a second edge detection signal generator configured to generate a second edge detection signal by performing an exclusive OR operation to a complementary signal of the input clock signal, an inverted signal of the complementary signal, a second gating control signal which is generated by delaying the complementary signal, and an inverted signal of the second gating control signal; and
a differential clock generator configured to generate first and second clock signals based on an output clock signal which is generated by combining the first edge detection signal and the second edge detection signal.

2. The semiconductor apparatus of claim 1, wherein the first edge detection signal generator further comprises a first delay circuit configured to generate the first gating control signal by delaying the input clock signal.

3. The semiconductor apparatus of claim 2, wherein the second edge detection signal generator further comprises a second delay circuit configured to generate the second gating control signal by delaying the complementary signal of the input clock signal.

4. The semiconductor apparatus of claim 1, further comprising a phase mixer configured to generate the output clock signal by mixing phases of the first and second edge detection signals.

5. The semiconductor apparatus of claim 4,
wherein the phase mixer comprises:
a first buffer configured to buffer the first edge detection signal and output the first edge detection signal to the output node; and
a second buffer configured to buffer the second edge detection signal and output the second edge detection signal to the output node.

6. The semiconductor apparatus of claim 1, further comprising a level shifter configured to change a voltage level of the output clock signal and provide the changed output clock signal to the differential clock generator.

7. A semiconductor apparatus comprising:
a first edge detection signal generator configured to generate a first edge detection signal which is enabled based on falling edges of an input clock signal and an inverted signal of the input clock signal, and disabled based on rising edges of a first gating signal, which is generated by delaying the input clock signal, and an inverted signal of the first gating signal;
a second edge detection signal generator configured to generate a second edge detection signal which is enabled based on falling edges of a complementary signal of the input clock signal and an inverted signal of the complementary signal, and disabled based on rising edges of a second gating signal, which is generated by delaying the complementary signal, and an inverted signal of the second gating signal; and
a differential clock generator configured to generate first and second clock signals based on an output clock signal which is generated by combining the first edge detection signal and the second edge detection signal.

8. The semiconductor apparatus of claim 7, wherein the first edge detection signal generator enables the first edge detection signal in synchronization with the falling edge of the inverted signal of the input clock signal when the first gating control signal is disabled, and enables the first edge detection signal in synchronization with the falling edge of the input clock signal when the first gating control signal is enabled.

9. The semiconductor apparatus of claim 7, wherein the first edge detection signal generator disables the first edge detection signal in synchronization with the rising edge of the first gating control signal when the input clock signal is enabled, and disabled the first edge detection signal in synchronization with the rising edge of the inverted signal of the input clock signal when the input clock signal is disabled.

10. The semiconductor apparatus of claim 7, wherein the second edge detection signal generator enables the second edge detection signal in synchronization with the falling edge of the inverted signal of the complementary signal when the second gating control signal is disabled, and enables the second edge detection signal in synchronization with the falling edge of the complementary signal when the second gating control signal is enabled.

11. The semiconductor apparatus of claim 7, wherein the second edge detection signal generator disables the second edge detection signal in synchronization with the rising edge of the inverted signal of the second gating control signal when the complementary signal is disabled, and disables the second edge detection signal in synchronization with the rising edge of the second gating control signal when the complementary signal is enabled.

* * * * *